United States Patent
Oster et al.

(10) Patent No.: US 10,484,120 B2
(45) Date of Patent: Nov. 19, 2019

(54) WAVEGUIDE COUPLERS AND JUNCTIONS TO ENABLE FREQUENCY DIVISION MULTIPLEXED SENSOR SYSTEMS IN AUTONOMOUS VEHICLE

(71) Applicant: Intel Corporation, Santa Clara, CA (US)

(72) Inventors: Sasha N. Oster, Chandler, AZ (US); Georgios C. Dogiamis, Chandler, AZ (US); Telesphor Kamgaing, Chandler, AZ (US); Adel A. Elsherbini, Chandler, AZ (US); Johanna M. Swan, Scottsdale, AZ (US); Erich N. Ewy, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,868

(22) Filed: Sep. 30, 2017

(65) Prior Publication Data
US 2019/0103932 A1    Apr. 4, 2019

(51) Int. Cl.
*H04J 14/02* (2006.01)
*G02B 6/12* (2006.01)
(Continued)

(52) U.S. Cl.
CPC .......... *H04J 14/02* (2013.01); *G02B 6/12004* (2013.01); *G02B 6/12007* (2013.01);
(Continued)

(58) Field of Classification Search
CPC . H04J 14/02; G02B 6/12004; G02B 6/12007; G02B 6/12019; G02B 6/12033;
(Continued)

(56) References Cited

U.S. PATENT DOCUMENTS 4,441,091 A * 4/1984 Nishida .................. H01Q 13/20
                                                       333/236
5,684,495 A * 11/1997 Dyott ..................... H01Q 13/24
                                                       333/21 R
(Continued)

FOREIGN PATENT DOCUMENTS

WO    WO 2016092084 A1 *  6/2016 .............. H01P 5/107

OTHER PUBLICATIONS

Withayachumnankul et al., All-dielectric integration of dielectric resonator antenna and photonic crystal waveguide, Optics Express, V. 25, N. 13, Jun. 26, 2013, 14706.*
(Continued)

*Primary Examiner* — Peter Radkowski
(74) *Attorney, Agent, or Firm* — Schwabe, Williamson & Wyatt, P.C.

(57) ABSTRACT

Embodiments include a wavelength selective communication system for use in vehicles. In an embodiment, the communication system may include a primary dielectric waveguide having a first cross-sectional area. In an embodiment, a coupling arm dielectric waveguide may be communicatively coupled to the primary dielectric waveguide. In an embodiment, the coupling arm has a second cross-sectional area that is smaller than or equal to the cross-sectional area of the first cross-sectional area. According to an embodiment, the coupling arm is communicatively coupled to the primary dielectric waveguide by a waveguide connector.

10 Claims, 8 Drawing Sheets

(51) Int. Cl.
  *H01S 5/024*  (2006.01)
  *H04B 10/50*  (2013.01)
  *H04B 10/572* (2013.01)
  *H04B 10/90*  (2013.01)
(52) U.S. Cl.
  CPC ..... *G02B 6/12019* (2013.01); *G02B 6/12033* (2013.01); *H01S 5/02415* (2013.01); *H04B 10/506* (2013.01); *H04B 10/572* (2013.01); *H04B 10/90* (2013.01)
(58) Field of Classification Search
  CPC .. H01S 5/02415; H04B 10/506; H04B 10/572
  See application file for complete search history.

(56) References Cited

U.S. PATENT DOCUMENTS

| | | | | |
|---|---|---|---|---|
| 6,323,818 | B1* | 11/2001 | Koh | H01Q 1/38 343/772 |
| 6,816,118 | B2* | 11/2004 | Kingsley | H01Q 3/24 342/368 |
| 6,927,745 | B2* | 8/2005 | Brown | H01Q 1/281 343/909 |
| 7,173,577 | B2* | 2/2007 | Brown | H01Q 1/281 343/909 |
| 7,209,088 | B2* | 4/2007 | Maruyama | H01Q 9/0407 343/700 MS |
| 7,528,787 | B2* | 5/2009 | Louzir | H01Q 13/0225 343/786 |
| 7,710,325 | B2* | 5/2010 | Cheng | H01Q 9/065 343/700 MS |
| 7,835,600 | B1* | 11/2010 | Yap | G01R 29/0885 385/1 |
| 8,604,991 | B2* | 12/2013 | Nagayama | H01Q 21/064 343/772 |
| 8,903,211 | B2* | 12/2014 | Fini | G02B 6/2856 359/341.32 |
| 9,178,258 | B1* | 11/2015 | Brown | H01P 3/12 |
| 9,917,342 | B2* | 3/2018 | Chang | G02B 6/032 |
| 2001/0029368 | A1* | 10/2001 | Berube | A61B 18/18 606/33 |
| 2003/0184478 | A1* | 10/2003 | Kingsley | H01Q 3/24 343/700 MS |
| 2005/0047741 | A1* | 3/2005 | Sfez | G02B 6/00 385/129 |
| 2005/0057431 | A1* | 3/2005 | Brown | H01Q 1/281 343/909 |
| 2005/0237267 | A1* | 10/2005 | Brown | H01Q 1/281 343/909 |
| 2006/0050003 | A1* | 3/2006 | Maruyama | H01Q 9/0407 343/772 |
| 2007/0165991 | A1* | 7/2007 | Huber | G02B 6/032 385/125 |
| 2008/0036558 | A1* | 2/2008 | Suarez-Gartner | H01P 3/127 333/239 |
| 2009/0058747 | A1* | 3/2009 | Haziza | H01Q 3/22 343/772 |
| 2009/0303147 | A1* | 12/2009 | Choudhury | H01Q 13/0283 343/776 |
| 2010/0060537 | A1* | 3/2010 | Nagayama | H01Q 1/247 343/776 |
| 2010/0135626 | A1* | 6/2010 | Sun | H01P 3/16 385/123 |
| 2012/0283534 | A1* | 11/2012 | Carr | A61B 5/01 600/324 |
| 2013/0021207 | A1* | 1/2013 | Lee | H01Q 1/38 343/700 MS |
| 2013/0099989 | A1* | 4/2013 | Pantea | G01F 23/284 343/783 |
| 2014/0036351 | A1* | 2/2014 | Fini | G02B 6/2856 359/341.31 |
| 2015/0372376 | A1* | 12/2015 | Le | H01Q 1/246 370/338 |
| 2016/0018264 | A1* | 1/2016 | Bowers | G01V 8/005 374/122 |
| 2016/0064795 | A1* | 3/2016 | Chang | G02B 6/032 343/893 |
| 2016/0172741 | A1* | 6/2016 | Panat | B22F 3/1055 29/600 |
| 2017/0324135 | A1* | 11/2017 | Blech | H01P 5/107 |

OTHER PUBLICATIONS

Kronberger et al., 3D-Printed Frequency Selective Surfaces for Microwave Absorbers, Proceedings of ISAP2016, Okinawa, Japan, 2C1-4.*

Ariffin et al., Cross-section absorption properties for broadband microwave, 2013 IEEE Symposium on Wireless Technology & Applications (ISWTA), Kuching, 2013, pp. 207-211.*

Lapchuk et al., Mode propagation in optical nanowaveguides with dielectric cores and surrounding metal layers, Appl. Opt. 44, 7522-7531 (2005).*

Murakowski et al., Photonic probing of radio waves for k-space tomograph, Optics Express, V. 25, N. 14, Jul. 10, 1017 15746.*

* cited by examiner

WAVEGUIDE COUPLERS AND JUNCTIONS TO ENABLE FREQUENCY DIVISION MULTIPLEXED SENSOR SYSTEMS IN AUTONOMOUS VEHICLE

FIELD OF THE INVENTION

Embodiments of the invention are in the field of semiconductor packaging and, in particular, formation of pluggable mm-wave interconnects for use in automotive applications.

BACKGROUND OF THE INVENTION

The automotive industry is rapidly progressing towards the production of autonomous and/or self-driving vehicles. Autonomous vehicles utilize many sensors that generate data regarding the position of the vehicle relative to surrounding objects, such as the road, other cars, traffic signals, lane markings, pedestrians, and the like. As illustrated in FIG. 1, a vehicle 100 may include any number of sensors 102, video cameras 103, and positioning systems 104, such as global positioning systems (GPS). For example, sensors 102 may include video sensors, image sensors, ultrasonic sensors, radar sensors, light detection and ranging (LIDAR) sensors, or the like. The data generated from these components needs to be processed in order to determine how the vehicle needs to react. As such, the generated data is transferred from the peripheral components to an electronic control unit (ECU) 105 over a plurality of interconnects 107. Accordingly, the additional peripheral sensors and other components needed for autonomous and/or self-driving vehicle results in a significant increase in the amount of data that is transferred within the vehicle.

Currently, autonomous vehicles that are being tested utilize data-transfers at rates between approximately 1.0 Gbps and 1.5 Gbps and employ four different low-voltage differential signaling (LVDS) lanes to allow for a total data rate between approximately 4.0 Gbps and 6.0 Gbps. However, the data rate needed in the subsequent generations of autonomous vehicles is expected to increase to approximately 10 Gbps or more (i.e., approximately 2.5 Gbps using four differential LVDS lanes). This increase in the data rate far exceeds the data rate of existing systems in currently available vehicles. For example, the standard for multimedia and infotainment networking in vehicles i.e., media oriented systems transport bus (MOST) has a data transfer rate of 150 Mbps.

Some solutions for providing high-speed interconnects include electrical interconnects and optical interconnects. However, both suffer significant drawbacks when used in the automotive industry. Electrical connections, such as ethernet, may be utilized by employing multiple lanes (i.e., cables) to reach the required bandwidth. However, this becomes increasingly expensive and power hungry to support the required data rates for short to intermediate (e.g., 5 m -10 m) interconnects needed in the automotive industry. For example, to extend the length of a cable or the given bandwidth on a cable, higher quality cables may need to be used or advanced equalization, modulation, and/or data correction techniques employed. Unfortunately, these solutions require additional power and increase the latency of the system. Latency increases are particularly problematic in autonomous vehicles due to the need to make rapid decisions (e.g., braking, avoidance maneuvers, drive train corrections, etc.) needed to ensure the safety of passengers within the vehicle and/or persons and/or property external to the vehicle.

Optical transmission over fiber is capable of supporting the required data rates and distances needed for autonomous and/or self-driving vehicles. However, the use of optical connections results in a severe power and cost penalty, especially for short to medium distances (e.g., 5 m-10 m) because of the need for conversion between optical and electrical signals. Furthermore, the alignment of optical interconnects needs to be precisely maintained. This proves to be difficult in automotive applications due to vibrations and other environmental conditions that may alter the alignment of the optical interconnects, and therefore, reduces the reliability of optical interconnects.

Accordingly, both technologies (traditional electrical and optical) are not optimal for autonomous and/or self-driving vehicles that require high data-rate, low latency, and low power interconnect lines between peripheral sensors and the ECU.

DETAILED DESCRIPTION OF THE INVENTION

Figure 1:
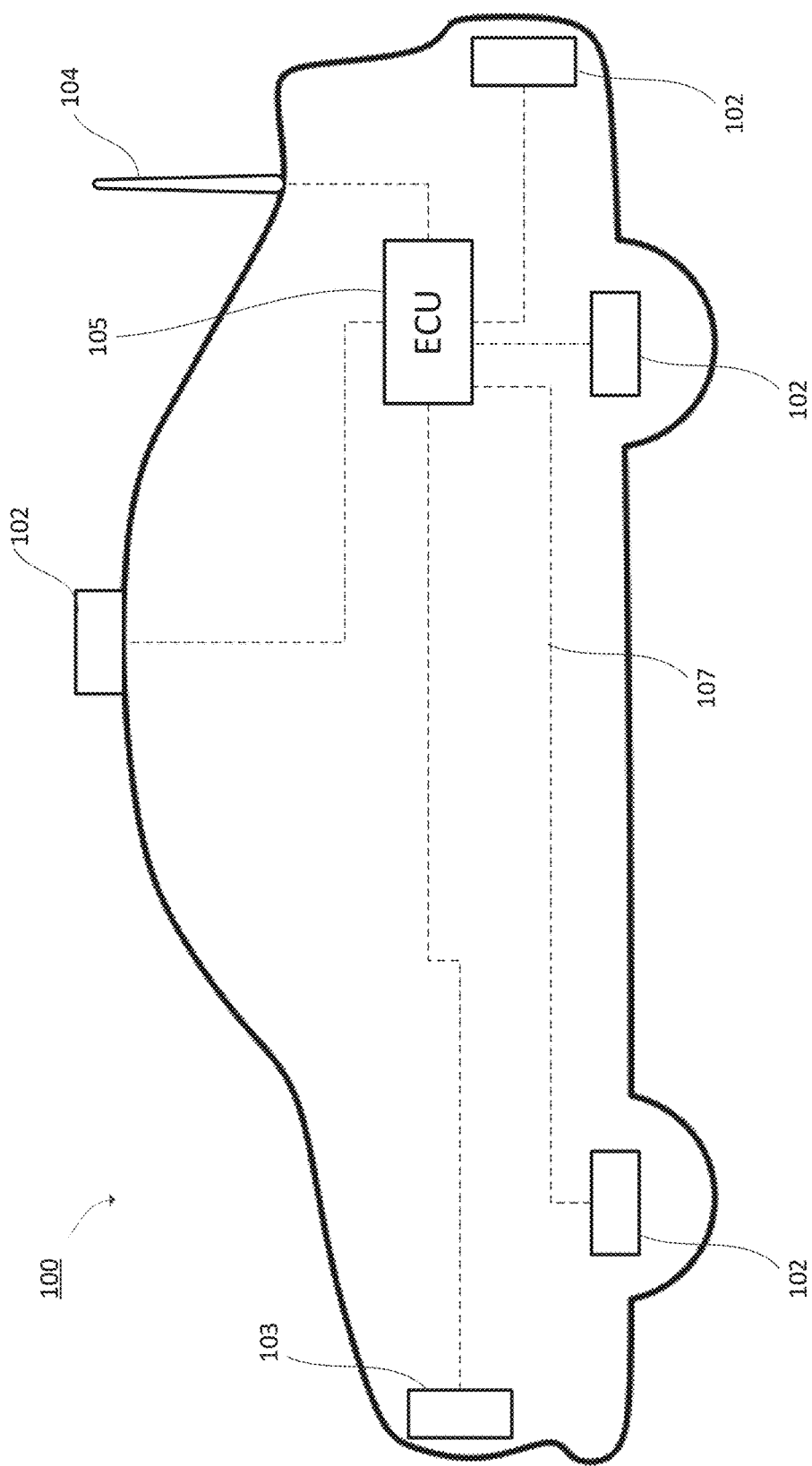
FIG. 1 is a schematic of an automobile that includes a plurality of sensors and other peripheral components that are communicatively linked to an electronic control unit (ECU).

Described herein are systems that include mm-wave interconnects that are included in a ring architecture that are used in autonomous and/or self-driving vehicles, according to embodiments of the invention. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, currently available interconnect solutions (i.e., electrical cables and optical cables) do not satisfy data rate, power consumption, latency, and cost targets needed for autonomous and/or self-driving vehicles (e.g., cars, trucks, trains, boats, planes, and any other autonomous transportation/cargo vehicle). Accordingly, embodiments of the invention include millimeter-wave waveguide (mm-wave waveguide) interconnect solutions. In an embodiment, the mm-wave waveguide comprises a dielectric waveguide bundle that is made out of low loss coated or uncoated dielectric materials designed to operate in the mm-wave or sub-THz frequency range. The waveguides may be coupled at both ends to a package that includes a mm-wave engine. In short to medium length cables (e.g., 0.5-15 meters or greater), the mm-waveguide cables provide a low power, low latency, high-speed, and low cost solution. Particularly, since signals do not need to be up-converted to an optical signal, the power consumption is significantly lower than the power consumption of the alternative optical fiber interconnect technology. Additionally, in the short to medium length cables, there may be no need for error correction (EC), since achieved bit-error-rate level rates are very low (below 10 E-12). Therefore, the achieved latency may be significantly lower compared to the traditional electrical interconnect especially at high datarates, where EC is needed.

Furthermore, the increased number of interconnect lines results in added weight and cost to the system. Particularly, when each sensor requires a dedicated interconnect line, each additional sensor increases the overall cost of the system, since a new interconnect line is needed. Additionally, each additional sensor would require an available connector at the ECU. As such, future modifications to the vehicle (e.g., to provide additional sensors, or the like) may not be possible.

Figure 2A:
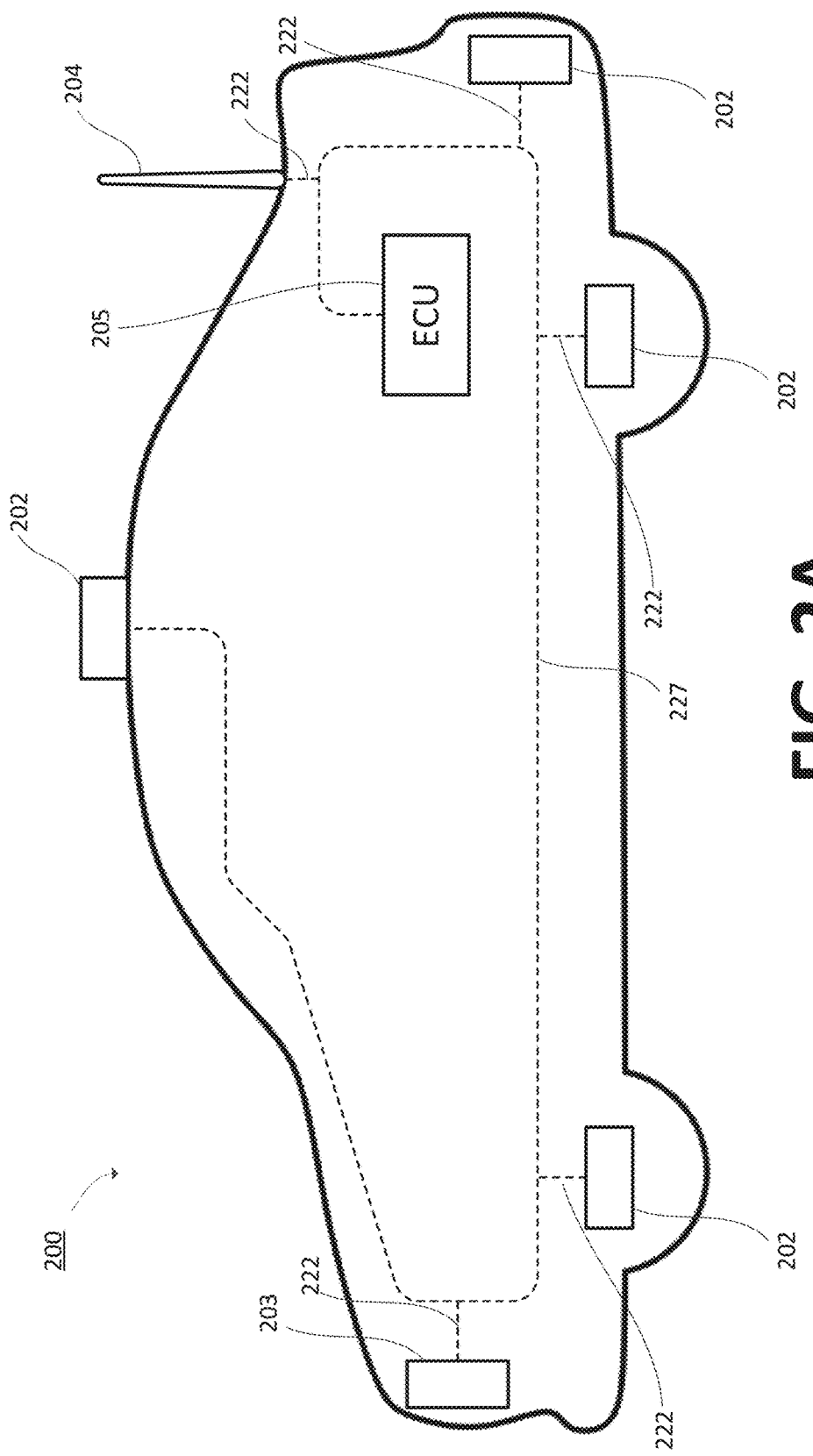
FIG. 2A is a schematic of an automobile that includes a plurality of sensors that are communicatively linked to an ECU in a ring architecture, according to an embodiment of the invention.

Accordingly, embodiments of the invention include a plurality of sensors that are each are communicatively coupled with the ECU by a primary dielectric waveguide in a ring architecture. A schematic of such an embodiment is illustrated in FIG. 2A. As illustrated, a primary dielectric waveguide 227 propagates the signal from the ECU 205 to each sensor 202 or other component 203, 204. Each of the sensors are then coupled to the primary dielectric waveguide by a coupling arm 222. As such, only the primary dielectric waveguide 227 needs to be directly connected to the ECU 205.

Currently available waveguide couplers that would allow for communication systems such as those illustrated in FIG. 2A are simply power splitters and are not wavelength selective. Therefore, the amount of RF power sent from the ECU is dependent on the number of sensors 202. For example, a system with four sensors 202 would require three power splitters. If each splitter is a 50/50 splitter, the fourth sensor in the chain would receive one-eighth of the incident power and one-fourth of the power of the first sensor 202. This requires significant additional amplification of the signal and amplifiers that work over a significant input power. Even if more intelligent coupler ratios are chosen, one sensor will always receive less than 1/N of the incident power.

As such, embodiments of the invention include coupling arms that may be configured such that each coupling arm is wavelength selective. A wavelength selective coupling arm allows multiple channels to operate while eliminating power amplification issues because only power over a predetermined bandwidth is coupled with the primary dielectric waveguide at each coupling arm instead of a portion of the entire operating band of the primary waveguide. Accordingly, each coupling arm couples in the frequency band from the sensor to which it is connected without filtering out the bands already propagating on the primary waveguide.

Figure 2B:
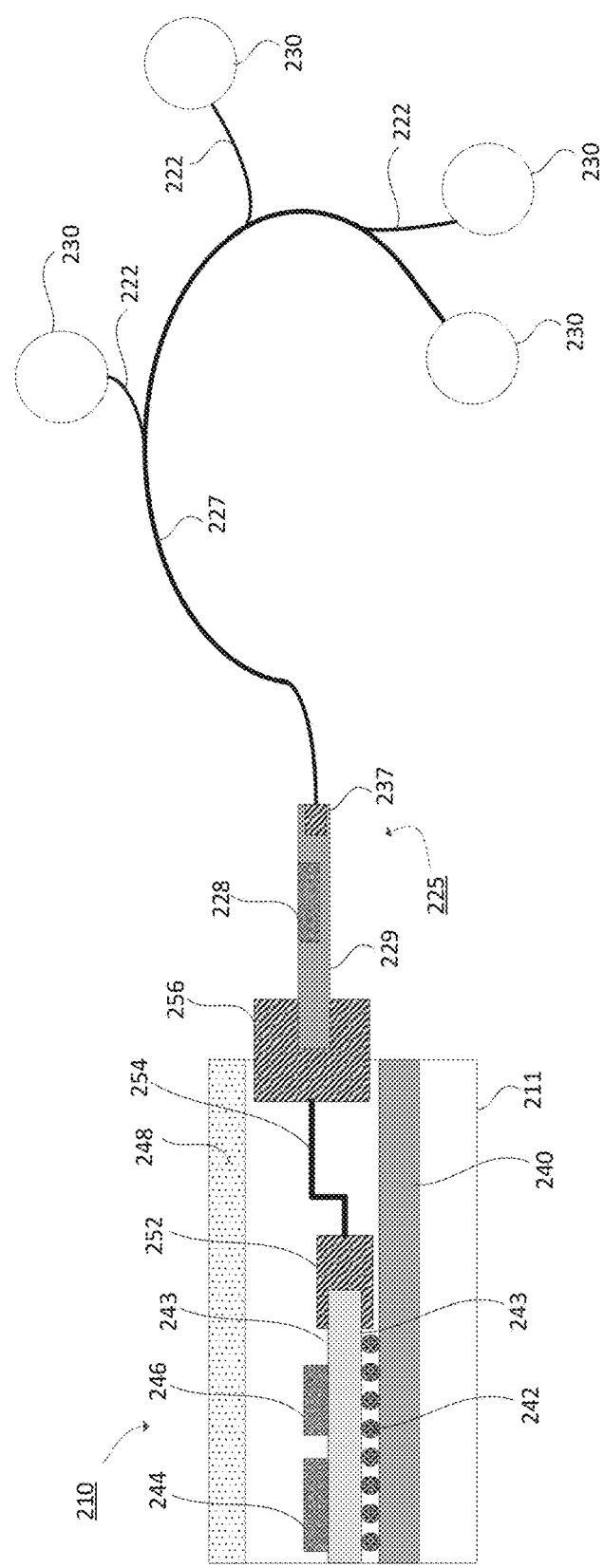
FIG. 2B is a schematic illustration of an active mm-wave interconnect with pluggable connectors that is plugged into an ECU and a plurality of sensors communicatively coupled in a ring architecture, according to an embodiment of the invention.

Referring now to FIG. 2B, a cross-sectional illustration of a primary dielectric waveguide 227 plugged into an ECU 210 and coupled to a plurality of sensors 230 by coupling arms 222 is shown, according to an embodiment of the invention. In an embodiment, the primary dielectric waveguide 227 and the coupling arms 222 may be suitable for propagating mm-wave signals. The primary dielectric waveguide 227 and the coupling arms 222 may be any suitable dielectric material, such as liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), perfluoroalkoxy alkanes (PFA), combinations thereof, or the like. In an embodiment, the primary dielectric waveguides 227 and the coupling arms 222 may have any shaped cross section, including, but not limited to, rectangular (with or without rounded corners), square, circular, oval, among others.

In an embodiment, the primary dielectric waveguide 227 and the coupling arms 222 may also include a metallic coating (not shown) to provide electrical shielding to the dielectric waveguide. In some embodiments, the metallic coating may be used as a power line. For example, power may be applied on a shield along the primary dielectric waveguide 227 or the coupling arms 222. While a single primary dielectric waveguide 227 is shown extending from a connector 225, it is to be appreciated that a bundle of two or more primary dielectric waveguides 227 may be coupled to the connector 225.

In an embodiment, an end of the primary dielectric waveguides 227 may be coupled to a connector 225 that interfaces with the ECU 210. According to an embodiment, the connector 225 includes a mm-wave engine 228 that is packaged on a mm-wave packaging substrate 229. In an embodiment, signals from the mm-wave engine 228 may be communicatively coupled to a waveguide launcher 237 that propagates the signal into the dielectric waveguide 227. In an embodiment, the dielectric waveguide may be coupled to the launcher 237 by a connector, which is not shown in order to not obscure embodiments of the invention. While illustrated as being embedded within mm-wave packaging substrate 229, it is to be appreciated that the waveguide launcher 237 and connector may be formed at any location, including the top or bottom surface of the mm-wave packaging substrate 229. In the illustrated embodiment, the connector 225 is shown without a protective enclosure in order to not obscure the Figure. However, it is to be appreciated that the connector 225 may include multiple different packaging substrates, protective enclosures, overmolding, heat management solutions, and/or other needed components. For example, the mm-wave engine 228 may be packaged on a packaging substrate 228 and may be substantially enclosed by a protective casing. Furthermore, while the mm-wave engine 228 is illustrated as a single block, it is to be appreciated that the mm-wave engine 228 may include any number of discrete dies, interconnects, and/or other components. Additionally, while each coupling arm 222 is illustrated as being connected directly to a sensor 230, it is to be appreciated that the coupling arms 222 may be coupled to the sensor by a connector (similar to the connector 225). According to an additional embodiment, the connector 225 may not include a mm-wave engine. In such embodiments, the mm-wave engine 228 may be packaged within the ECU 210 and/or sensor 230.

In an embodiment, the ECU 210 may include a central processing unit (CPU) die 244 that is packaged on a packaging substrate 243. The packaging substrate 243 may be coupled to an ECU printed circuit board (PCB) 240 by solder bumps 242, such as a ball grid array (BGA), a land grid array (LGA), a socket, or any other known interconnect. In some embodiments, a predefined digital interconnect interface die 246 electrically coupled between CPU die 244 and the mm-wave engine 228 may also be packaged on the same packaging substrate 243 on which the CPU die 244 is packaged. For example, the predefined digital interconnect interface die 246 may translate and/or condition a signal so that signals may pass between the CPU die 244 and the mm-wave engine 228 even when the output of either of the CPU die 244 or the mm-wave engine 228 does not match the type of input expected by the other component. In some embodiments a heatsink 248 or any other thermal management technology may also be included in the ECU 210. For example, the heatsink 248 may be a liquid cooled heatsink 248, such as one that is connected to the cooling systems in the autonomous vehicle. In the illustrated embodiment, the heatsink 248 is formed over a surface of an ECU enclosure 211. However, the heatsink 248 may be within the ECU enclosure 211 in some embodiments of the invention.

Embodiments of the invention may include a predefined interface 252 that couples the CPU packaging substrate 243 to a first end of an internal cable 254. The internal cable 254 may be any suitable electrical cable, such as a twinaxial cable, or the like. The internal cable 254 may extend to the edge of the ECU enclosure 211 where it is coupled to an external predefined interface 256. The external predefined interface 256 may be any suitable interface. For example, the external predefined interface 256 may be a SFP, a QSFP, or the like.

Figure 3:
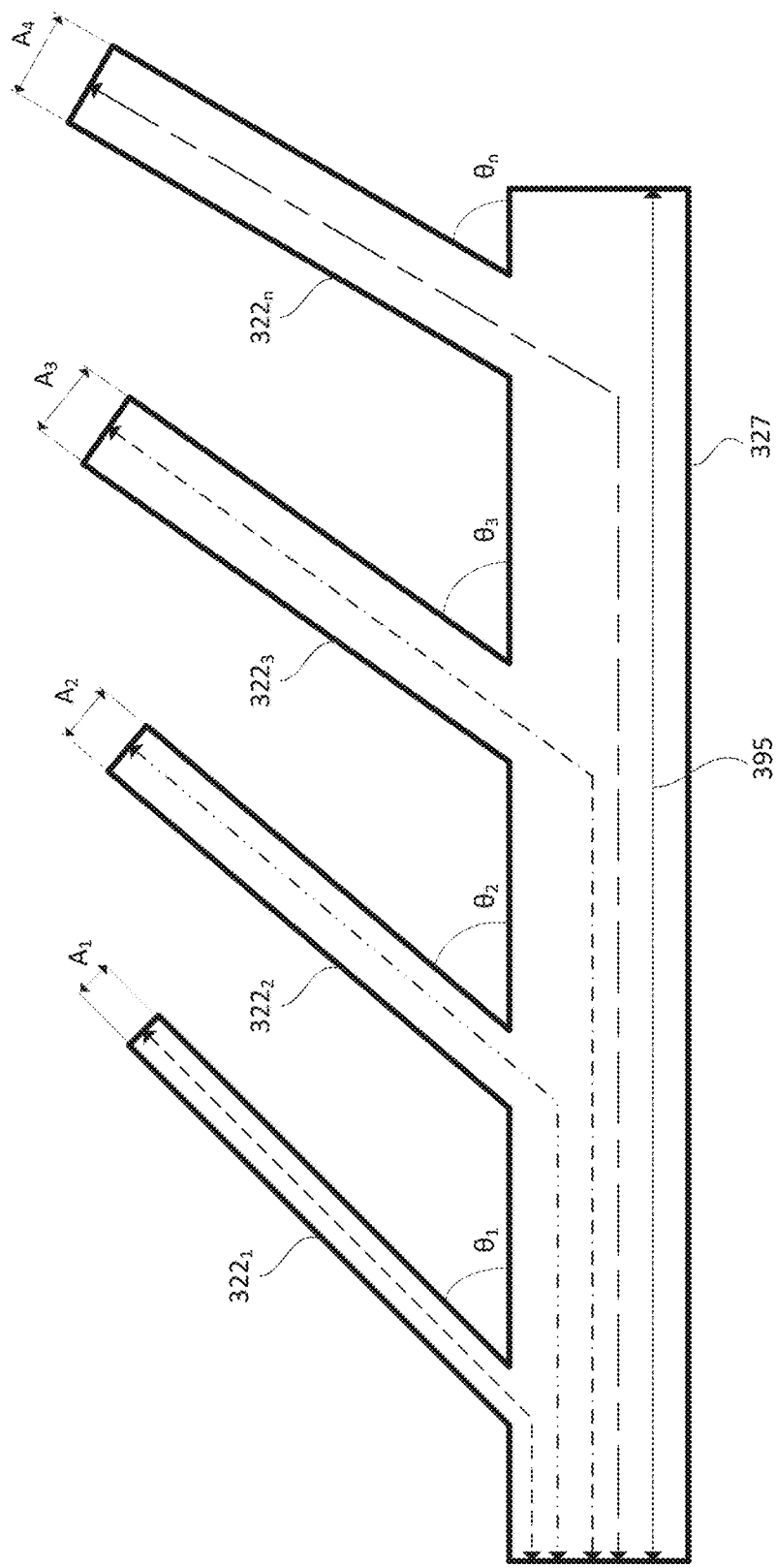
FIG. 3 is a schematic of the how each branch along the ring architecture is coupled to the main branch of the dielectric waveguide, according to an embodiment of the invention.

Referring now to FIG. 3, a schematic illustration of a primary dielectric waveguide 327 and a plurality of coupling arms $322_1$-$322_n$ are shown, according to an embodiment of the invention. The coupling arms 322 provide frequency selectivity by adjusting dimensions of the aperture A and angle θ such that each coupling arm 322 has an effective aperture that has a cut-off frequency at the lower end of the band of interest. Accordingly, each coupling arm 322 functions as a high pass filter and only allows the highest frequency band to pass through. The use of such an architecture (i.e., sequential high pass filters) necessitates that the coupling arms 322 be arranged in a certain order along the length of the primary dielectric waveguide 327. Particularly, the coupling arm 322 nearest to the ECU accommodates the highest frequency band, the next coupling arm 322 along the length of the primary dielectric waveguide 327 accommodates the next lowest frequency band, etc. In the illustrated embodiment, each frequency band 395 is represented with a different dashed line pattern. In an exemplary ring architecture for a three sensor system with Teflon dielectric waveguides and operating at center bands of 56 GHz, 60 GHz, and 64 GHz, the primary waveguide 327 may have cross-sectional dimensions of 3 mm×1.5 mm, and include a first coupling arm $322_1$ with an aperture $A_1$ that includes dimensions of 1.68 mm×0.84 mm at an angle $θ_1$ of 20 degrees and a second coupling arm $322_2$ with an aperture $A_2$ that includes dimensions 1.76 mm×0.88 mm at an angle $θ_2$ of 18 degrees.

Figure 4A:
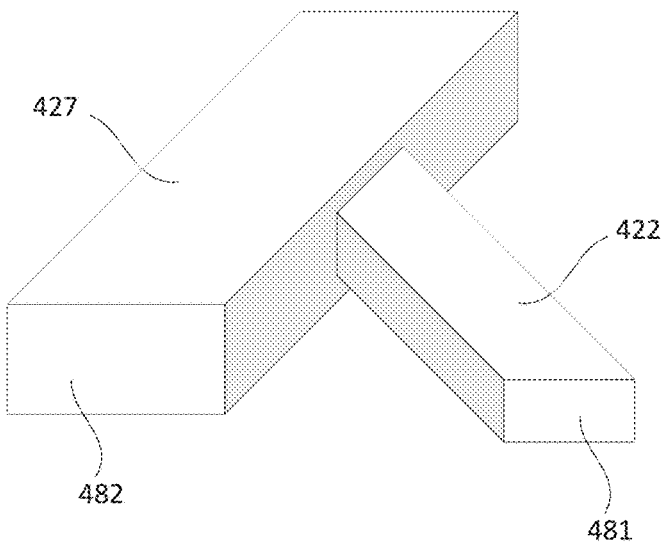
FIG. 4A is a perspective view of the coupling region of a dielectric waveguide, according to an embodiment of the invention.

Referring now to FIG. 4A, a perspective view of a portion of a coupling arm 422 as it merges into the primary dielectric waveguide 427 is shown, according to an embodiment of the invention. It is to be appreciated that the coupling arm 422 has smaller dimensions than the primary dielectric waveguide 427 (i.e., face 481 of the coupling arm 422 has a smaller cross-sectional area that a face 482 of the primary dielectric waveguide 427). This is because the coupling arm 422 only allows signals to propagate that have a cut off-frequency at or higher than the lowest frequency of the band of interest. In some embodiments, the coupling arm 422 and the primary dielectric waveguide 427 may be separately fabricated and subsequently fused together. In an embodiment, the fused components may then be coated with metal to prevent interference.

Figure 4B:
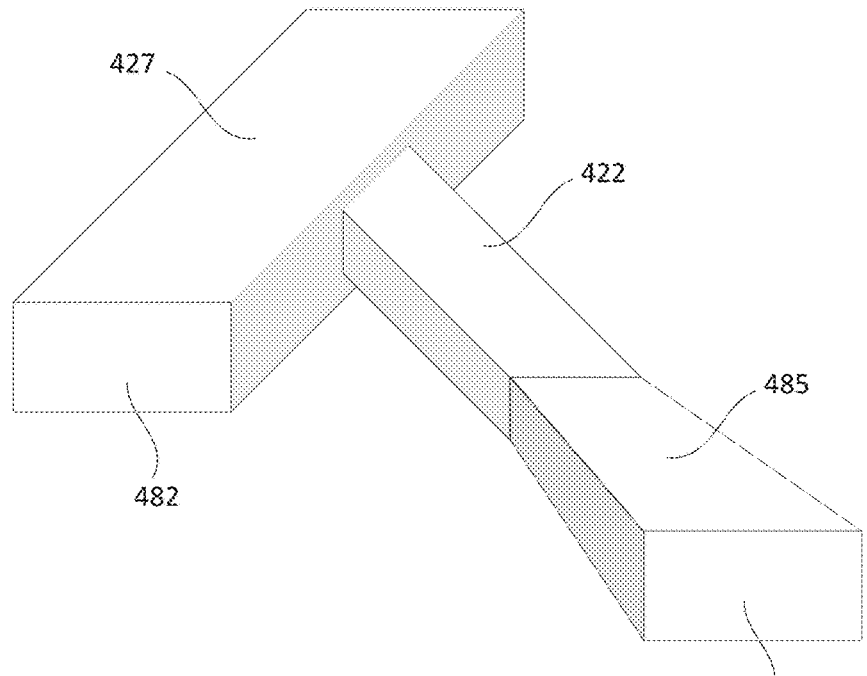
FIG. 4B is a perspective view of a coupling region of a dielectric waveguide that includes a tapered portion, according to an embodiment of the invention.

Referring now to FIG. 4B, a perspective illustration of a coupling arm 422 and the primary dielectric waveguide 427 is shown, according to an additional embodiment of the invention. As illustrated, the coupling arm 422 may further include a transition region 485. The transition region 485 may be a region of the coupling arm 422 that is tapered in order to change the dimensions of the face 481. Such an embodiment may be beneficial because propagating the chosen signal in the smaller dimensions of the aperture of the coupling arm 422 is lossy. Accordingly, the coupling arm 422 may be coupled to a dielectric waveguide that is the same size of the primary waveguide 427 with the tapered transition 485 in order to minimize losses.

In FIGS. 3, 4A, and 4B, the primary dielectric waveguide and the coupling arms are illustrated as being a substantially continuous dielectric material. While embodiments do include forming the primary dielectric waveguide and the coupling arms as a single component, additional embodiments allow for improved manufacturability by using waveguide connectors that couple distinct portions of dielectric material together.

Figure 5:
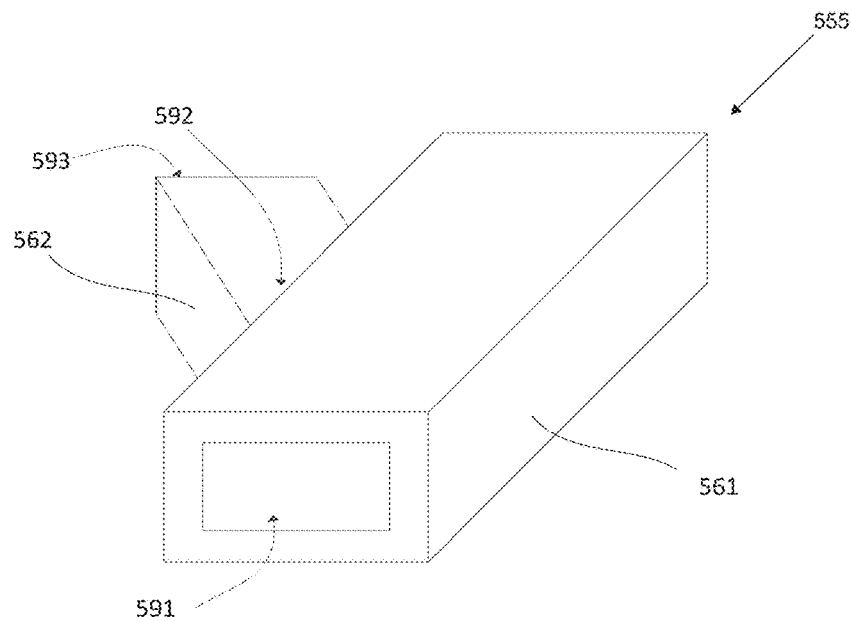
FIG. 5 is a perspective view of a waveguide connector that may be used to coupled dielectric waveguides, according to an embodiment of the invention.

FIG. 5 is a perspective view of a waveguide connector 555 that may be used to simplify the assembly of the ring architecture, according to an embodiment of the invention. In an embodiment, the waveguide connector 555 includes a primary portion 561 that includes apertures 591 for connecting the primary dielectric waveguides and a coupling arm portion 562 that functions as the coupling arm. In an embodiment, the coupling arm portion 562 may be manufactured to have a desired angle and aperture 592 in order to provide the desired frequency selectivity. In an embodiment, the coupling arm portion 562 may also include the transition region to taper the coupling arm back to the same dimensions as the primary dielectric waveguide. As such, assembly may be simplified because the second aperture 593 on the coupling arm portion 562 may be the same dimension as the apertures 591. Accordingly, all dielectric waveguides that are used in the assembly process may have the same cross-sectional area.

In an embodiment, the waveguide connector 555 is a conductive material. Additional embodiments may include a waveguide connector 555 that is any material (e.g., polymer) and includes metal coating on an interior surface. Furthermore, embodiments include a waveguide connector 555 that is completely hollow. In another embodiment the waveguide connector 555 may be partially filled with a dielectric material. In a particular embodiment, the dielectric material that partially fills the waveguide connector 555 may be the same dielectric used for the primary waveguide. In such embodiments, the dielectric waveguides are insertable into the waveguide connectors so that they make contact with the dielectric filling.

In yet another embodiment, the waveguide connector may also be a crimp connector. A crimp connector may include two halves that fold over the primary dielectric waveguide. In such an embodiment, the primary waveguide does not need to be cut since the crimp connector folds around and secures the primary dielectric waveguide while also including a coupling arm portion that secures the coupling arm dielectric waveguide. In addition to a crimp connector, a clippable connector may be used. A clippable connector is substantially similar to the crimp connector, but may be secured by a clip that is removable. Such an embodiment provides additional flexibility for reconfiguring and/or repairing the system.

Figure 6A:
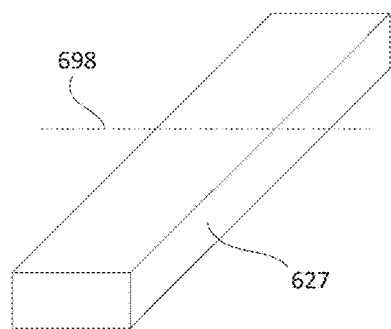
FIG. 6A is a perspective view of a dielectric waveguide with a cut-line, according to an embodiment of the invention.
Figure 6B:
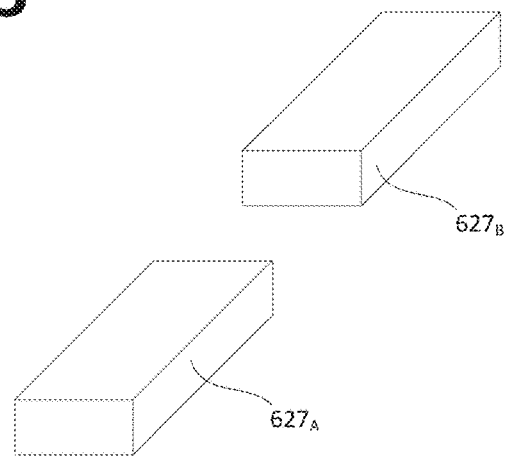
FIG. 6B is a perspective view of the dielectric waveguide after it has been cut, according to an embodiment of the invention.

Referring now to FIG. 6A-6E, a series of perspective views are shown that illustrate a process used for assembling a wavelength selective ring architecture, according to an embodiment. According to an embodiment, the illustrated process flow may use a single size dielectric waveguide, thereby reducing the system complexity. Starting with FIG. 6A, the primary waveguide 627 is cut at the point where a junction is desired, as indicated by the dashed line 698. As illustrated in FIG. 6B, the primary dielectric waveguide 627 is now separated into a first portion $627_A$ and a second portion $627_B$.

Figure 6C:
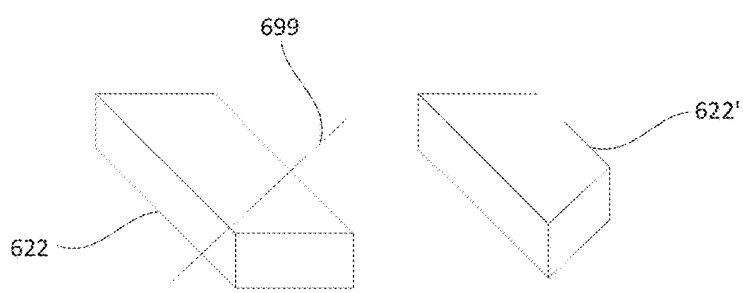
FIG. 6C is a perspective view of a dielectric waveguide with a cut line, and the resulting cut dielectric waveguide, according to an embodiment of the invention.

Referring now to FIG. 6C a portion of dielectric waveguide material used for the coupling arm 622 is shown, according to an embodiment. As illustrated, the coupling arm dielectric waveguide 622 may be cut along the dashed line 699 to form the desired angle for the a particular wavelength selectivity. An example of an angled coupling arm 622' (i.e., coupling arm 622 after it has been cut to the proper angle) is illustrated as well in FIG. 6C. While the angle of the coupling arm may be obtained by cutting the dielectric waveguide 622, it is to be appreciated that embodiments may also have accommodated the angle by the design on the waveguide connector (as described above with respect to FIG. 5). In such embodiments, there may be no need to make angled cuts on any dielectric waveguide, thereby simplifying assembly. In yet another embodiment, the end of the coupling arm waveguide 622 may be machined or heat treated to have the correct insertion geometry (e.g., taper machined into the waveguide).

Figure 6D:
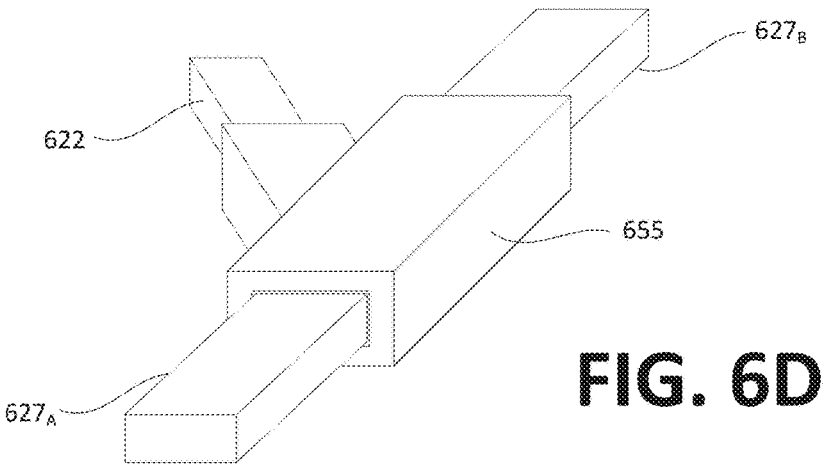
FIG. 6D is a perspective view of dielectric waveguides inserted into a waveguide connector, according to an embodiment of the invention.
Figure 6E:
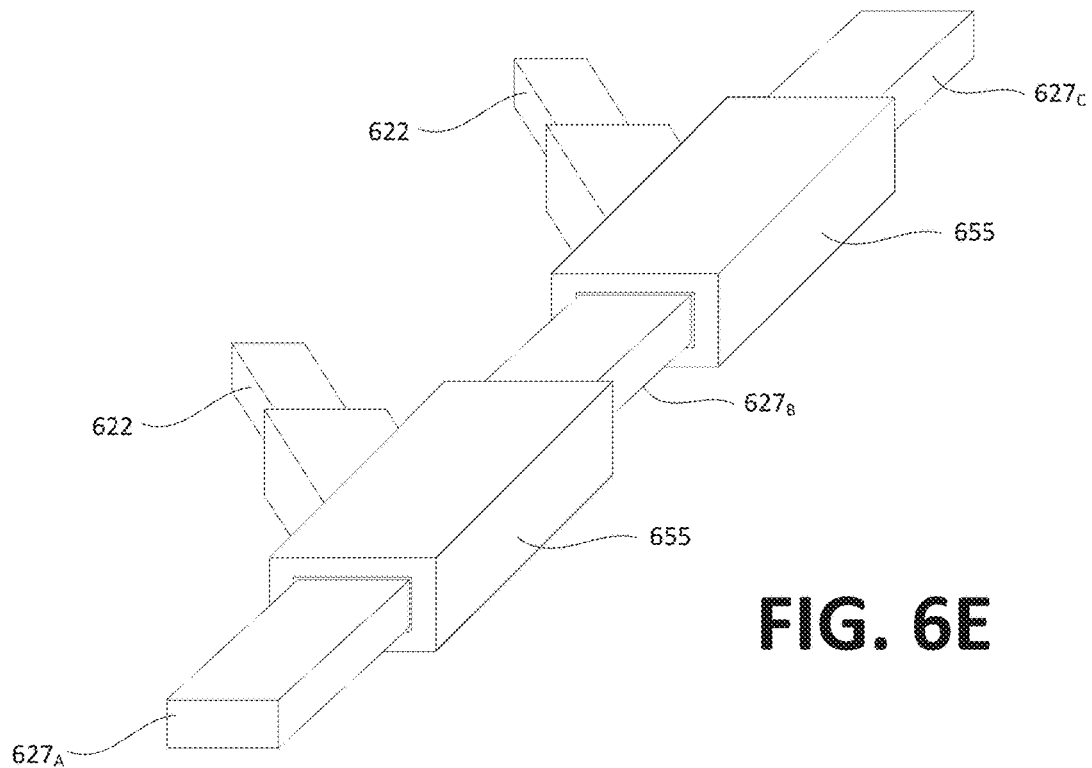
FIG. 6E is a perspective view of a plurality of waveguide connectors linked together by dielectric waveguides, according to an embodiment of the invention.

Referring now to FIG. 6D, the primary dielectric waveguides $627_A$ and $627_B$ and the coupling arm dielectric waveguide 622 (or 622') are inserted into the waveguide connector 655. As illustrated in FIG. 6E, the process illustrated in FIGS. 6A-6D may be repeated to provide a plurality coupling arms in order to accommodate any number of sensors or other desired components.

Figure 7:
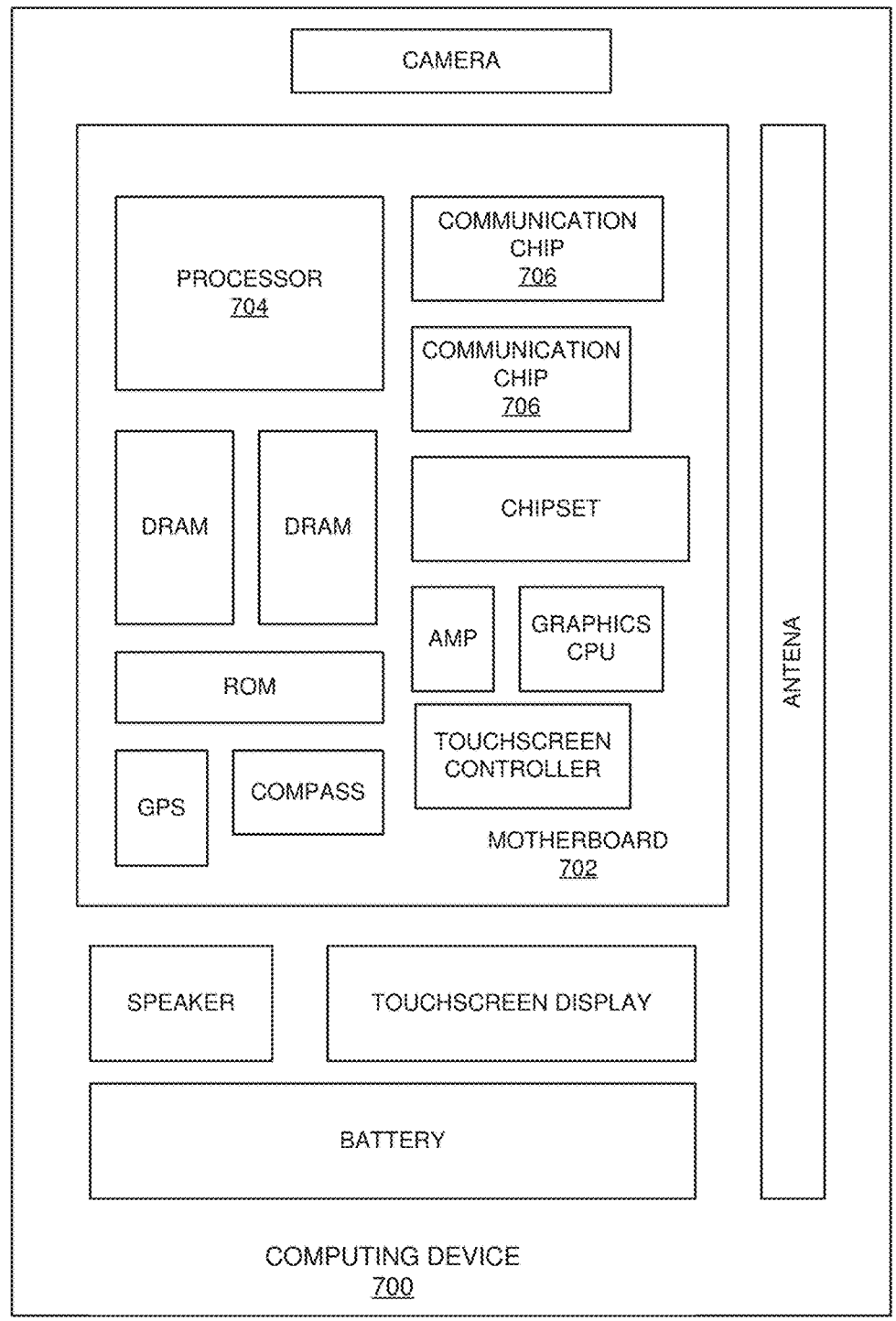
FIG. 7 is a schematic of a computing device built in accordance with an embodiment of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704. In yet another implementation, the communication chip 706 may function as a predefined interface (e.g., a serializer/deserializer, or the like).

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be packaged on an organic substrate and provide signals that are converted to a mm-wave signal and propagated along an active mm-wave interconnect with a wavelength selective ring architecture, in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be packaged on an organic substrate and provide signals that are converted to a mm-wave signal and propagated along an active mm-wave interconnect with a wavelength selective ring architecture, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

EXAMPLE 1

A wavelength selective communication system, comprising: a primary dielectric waveguide having a first cross-sectional area; and a coupling arm dielectric waveguide communicatively coupled to the primary dielectric waveguide, wherein the coupling arm has a second cross-sectional area that is smaller than or equal to the cross-sectional area of the first cross-sectional area.

EXAMPLE 2

The wavelength selective communication system of Example 1, wherein the first cross-sectional is suitable for propagating mm-wave or sub-terahertz frequency signals.

EXAMPLE 3

The wavelength selective communication system of Example 1 or Example 2, wherein the coupling arm is communicatively coupled to the primary dielectric waveguide by a waveguide connector.

EXAMPLE 4

The wavelength selective communication system of Examples 1-3, wherein the waveguide connector is a conductive material.

EXAMPLE 5

The wavelength selective communication system of Examples 1-4, wherein the waveguide connector is a polymer material and comprises a conductive coating over interior surfaces of the polymer material.

EXAMPLE 6

The wavelength selective communication system of Examples 1-5, wherein the interior of the waveguide connector is partially filled with a dielectric material.

EXAMPLE 7

The wavelength selective communication system of Examples 1-6, wherein the dielectric material in the waveguide connector is the same material as the primary dielectric waveguide.

EXAMPLE 8

The wavelength selective communication system of Examples 1-7, wherein the waveguide connector comprises a primary portion with apertures sized to accommodate the primary dielectric waveguide and a coupling arm portion sized to accommodate the coupling arm dielectric waveguide.

EXAMPLE 9

The wavelength selective communication system of Examples 1-8, wherein the coupling arm portion of the waveguide connector is tapered.

EXAMPLE 10

The wavelength selective communication system of Examples 1-9, further comprising a plurality of coupling arm dielectric waveguides communicatively coupled with the primary dielectric waveguide.

EXAMPLE 11

The wavelength selective communication system of Examples 1-10, wherein each of the plurality of coupling arm dielectric waveguides are mechanically coupled to the primary dielectric waveguide at different angles.

EXAMPLE 12

The wavelength selective communication system of Examples 1-11, wherein each of the plurality of coupling arm dielectric waveguides have different cross-sectional areas from each other, and wherein each of the cross-sectional areas of the plurality of coupling arm dielectric waveguides are smaller than the cross-sectional area of the primary dielectric waveguide.

EXAMPLE 13

The wavelength selective communication system of Examples 1-12, wherein each of the plurality of coupling arm dielectric waveguides are coupled to the primary dielectric waveguide by different waveguide connectors.

EXAMPLE 14

A wavelength selective communication system, comprising: a plurality of primary dielectric waveguides having a first cross-sectional area; a plurality of waveguide connectors, each comprising a primary portion with apertures sized to accommodate the primary dielectric waveguides and a coupling arm portion extending out from the primary portion at an angle, wherein the angles at which each of the coupling arm portions extend out from the primary portion are all different from each other; and a plurality of coupling arm dielectric waveguides, wherein each of coupling arm dielectric waveguides are inserted into a coupling arm aperture of one of the plurality of waveguide connectors.

EXAMPLE 15

The wavelength selective communication system of Example 14, wherein each of the plurality of waveguide connectors includes a coupling arm portion with different sized apertures that interface with the primary portion of the waveguide connectors.

EXAMPLE 16

The wavelength selective communication system of Examples 14 or 15, wherein each of the coupling arm portions are tapered, wherein an aperture facing away from the primary portion of the waveguide connectors are all the same dimensions.

EXAMPLE 17

The wavelength selective communication system of Examples 14-16, wherein the apertures facing away from the primary portion of the waveguide connectors are the same dimension as the apertures on the primary portions of the waveguide connectors.

EXAMPLE 18

The wavelength selective communication system of Examples 14-17, wherein the plurality of primary dielectric waveguides and the plurality of coupling arm dielectric waveguides all have the same cross-sectional dimensions.

EXAMPLE 19

The wavelength selective communication system of Examples 14-18, wherein each of the waveguide connectors are partially filled with a dielectric material.

EXAMPLE 20

The wavelength selective communication system of Examples 14-19, wherein each of the coupling arm dielectric waveguides include an end surface that is substantially orthogonal to the length of the coupling arm dielectric waveguide.

EXAMPLE 21

The wavelength selective communication system of Examples 14-20, wherein a surface of the coupling arm dielectric waveguides include an end surface that is formed at a non-orthogonal angle to the length of the coupling arm dielectric waveguide.

EXAMPLE 22

The wavelength selective communication system of Examples 14-21, wherein the angle of the end surface is substantially of each coupling arm dielectric waveguide is substantially equal to the angle that the coupling arm portion of the waveguide connector extends out from the primary portion.

EXAMPLE 23

A vehicle including a wavelength communication system, comprising: an electronic control unit (ECU); a plurality of primary dielectric waveguides having a first cross-sectional area, wherein a first primary dielectric waveguide is communicatively coupled to the ECU; a plurality of waveguide connectors, each comprising a primary portion with apertures sized to accommodate the primary dielectric waveguides and a coupling arm portion extending out from the primary portion at an angle, wherein the angles at which each of the coupling arm portions extend out from the primary portion are all different from each other; a plurality of coupling arm dielectric waveguides, wherein each of coupling arm dielectric waveguides are inserted into a coupling arm aperture of one of the plurality of waveguide connectors; and a plurality of sensors, wherein each sensor is communicatively coupled to a different coupling arm dielectric waveguide.

EXAMPLE 24

The vehicle of Example 23, wherein each sensor communicates with the ECU over a different frequency band.

EXAMPLE 25

The vehicle of Example 23 or 24, wherein the sensor furthest away from the ECU communicates over the lowest frequency band.

What is claimed is:

1. A wavelength selective communication system, comprising:
a primary dielectric waveguide having a first cross-sectional area;
a coupling arm dielectric waveguide communicatively coupled to the primary dielectric waveguide, wherein the coupling arm has a second cross-sectional area that is smaller than or equal to the cross-sectional area of the first cross-sectional area; and
a waveguide connector for communicatively coupling the primary dielectric waveguide to the coupling arm dielectric waveguide, wherein the waveguide connector comprises a primary portion with apertures sized to accommodate the primary dielectric waveguide and a coupling arm portion sized to accommodate the coupling arm dielectric waveguide, wherein the primary dielectric waveguide is within the primary portion of the waveguide connector, wherein the coupling arm dielectric waveguide is within the coupling arm portion of the waveguide connector, and wherein the coupling arm portion of the waveguide connector is tapered.

2. The wavelength selective communication system of claim 1, wherein the first cross-sectional is suitable for propagating mm-wave or sub-terahertz frequency signals.

3. The wavelength selective communication system of claim 1, wherein the waveguide connector is a conductive material.

4. The wavelength selective communication system of claim 1, wherein the waveguide connector is a polymer material and comprises a conductive coating over interior surfaces of the polymer material.

5. The wavelength selective communication system of claim 1, wherein the interior of the waveguide connector is partially filled with a dielectric material.

6. The wavelength selective communication system of claim 5, wherein the dielectric material in the waveguide connector is the same material as the primary dielectric waveguide.

7. The wavelength selective communication system of claim 1, further comprising a plurality of coupling arm dielectric waveguides communicatively coupled with the primary dielectric waveguide.

8. The wavelength selective communication system of claim 7, wherein each of the plurality of coupling arm dielectric waveguides are mechanically coupled to the primary dielectric waveguide at different angles.

9. The wavelength selective communication system of claim 7, wherein each of the plurality of coupling arm dielectric waveguides have different cross-sectional areas from each other, and wherein each of the cross-sectional areas of the plurality of coupling arm dielectric waveguides are smaller than the cross-sectional area of the primary dielectric waveguide.

10. The wavelength selective communication system of claim 7, wherein each of the plurality of coupling arm dielectric waveguides are coupled to the primary dielectric waveguide by different waveguide connectors.

\* \* \* \* \*